(12) United States Patent
Liebl et al.

(10) Patent No.: US 9,862,059 B2
(45) Date of Patent: Jan. 9, 2018

(54) SURFACING OF ADDITIVELY MANUFACTURED COMPONENTS AND CORRESPONDING MANUFACTURED COMPONENTS OF A TURBOMACHINE

(71) Applicant: MTU Aero Engines AG, Munich (DE)

(72) Inventors: Christian Liebl, Bockhorn (DE); Karl Blumenschein, Rohrmoos (DE); Steffen Schlothauer, Erdweg (DE); Thomas Hess, Munich (DE)

(73) Assignee: MTU Aero Engines AG, Munich (DE)

( * ) Notice: Subject to any disclaimer, the term of this patent is extended or adjusted under 35 U.S.C. 154(b) by 0 days.

(21) Appl. No.: 14/842,343

(22) Filed: Sep. 1, 2015

(65) Prior Publication Data

US 2016/0067828 A1    Mar. 10, 2016

(30) Foreign Application Priority Data

Sep. 8, 2014   (DE) .................. 10 2014 217 858

(51) Int. Cl.
| | |
|---|---|
| B23K 26/342 | (2014.01) |
| B23K 15/00 | (2006.01) |
| B22F 3/105 | (2006.01) |
| C23C 10/28 | (2006.01) |
| C23C 16/06 | (2006.01) |
| C23C 16/56 | (2006.01) |
| B22F 5/00 | (2006.01) |

(Continued)

(52) U.S. Cl.
CPC .......... *B23K 26/342* (2015.10); *B22F 3/1055* (2013.01); *B22F 5/009* (2013.01); *B22F 5/04* (2013.01); *B23K 15/0086* (2013.01); *C23C 10/28* (2013.01); *C23C 16/06* (2013.01); *C23C 16/56* (2013.01); *C22C 1/0433* (2013.01); *C22C 1/0458* (2013.01); *C22C 33/02* (2013.01); *F05D 2230/22* (2013.01); *F05D 2230/313* (2013.01); *F05D 2230/314* (2013.01); *F05D 2300/175* (2013.01); *F05D 2300/516* (2013.01); *Y02P 10/295* (2015.11)

(58) Field of Classification Search
None
See application file for complete search history.

(56) References Cited

U.S. PATENT DOCUMENTS

| | | |
|---|---|---|
| 6,504,127 B1 | 1/2003 | McGregor et al. |
| 6,852,179 B1 | 2/2005 | Toller et al. |

(Continued)

FOREIGN PATENT DOCUMENTS

| | | |
|---|---|---|
| DE | 10 2010 026 139 A1 | 1/2012 |
| DE | 10 2011 111 011 A1 | 2/2013 |

(Continued)

*Primary Examiner* — Joseph Miller, Jr.
(74) *Attorney, Agent, or Firm* — Barlow, Josephs & Holmes, Ltd.

(57) ABSTRACT

The present invention relates to a method for manufacturing components, in particular components of turbomachines, such as aircraft engines, wherein an additive method is used at least partially for the manufacture of the component (1), wherein at least one surface region (3) of the additively manufactured portion of the component (1) is provided with a smoothing layer (2), which is deposited by vapor deposition. In addition, the invention relates to a correspondingly manufactured component of a turbomachine.

18 Claims, 1 Drawing Sheet

(51) Int. Cl.
*B22F 5/04* (2006.01)
*C22C 1/04* (2006.01)
*C22C 33/02* (2006.01)

(56) References Cited

U.S. PATENT DOCUMENTS

2013/0071562 A1* 3/2013 Szuromi ............... B22F 3/1055
427/237
2014/0037983 A1* 2/2014 Godfrey ............... B22F 3/1266
428/654

FOREIGN PATENT DOCUMENTS

| DE | 10 2011 086 889 A1 | 5/2013 |
| DE | 10 2009 010 110 B4 | 8/2014 |
| EP | 2692464 A2 | 2/2014 |

* cited by examiner

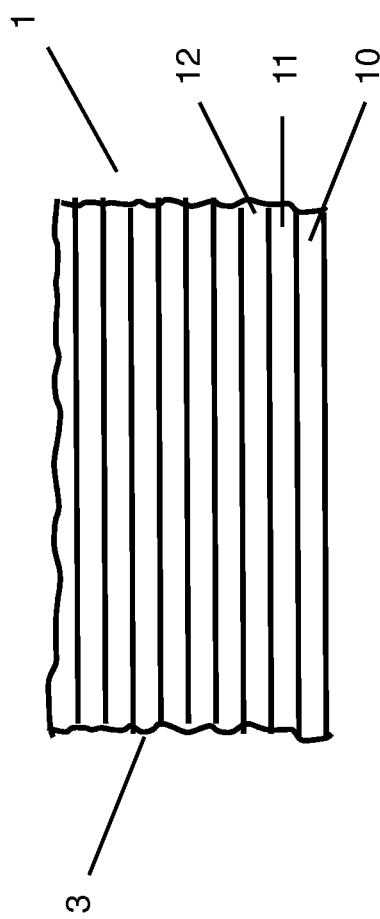
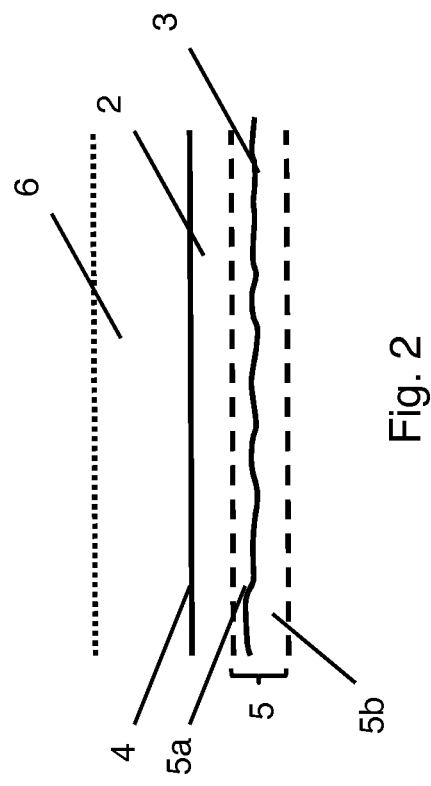

SURFACING OF ADDITIVELY MANUFACTURED COMPONENTS AND CORRESPONDING MANUFACTURED COMPONENTS OF A TURBOMACHINE

BACKGROUND OF THE INVENTION

Field of the Invention

The present invention relates to a method for manufacturing a component of a turbomachine, in particular an aircraft engine, with the use of a generative or additive manufacturing method, as well as a corresponding manufactured component.

Prior Art

Additive manufacturing methods in which a component is built up layer by layer from a powder material, such as powder hardfacing, selective laser melting, selective laser sintering, selective electron-beam melting, selective electron-beam sintering, and the like are manufacturing methods of interest for components of turbomachines, such as stationary gas turbines or aircraft engines, since difficult-to-process materials, which are difficult to cast, for example, can be used with this method, and also components having near-final contours can be produced, so that complicated post-processing by means of machining methods such as milling can be dispensed with.

Of course, in additively manufactured components, there is the problem that the surface quality in part does not fulfill requirements with respect to roughness, in particular for application in turbomachines. Thus, components having surfaces that are too rough as flow surfaces, that is, surfaces over which a fluid flows, have a flow resistance that is too high or negatively affect the flow conditions due to undesired vortexing of the fluid flow. In addition, rough surfaces are in part unsuitable for ambient conditions, since rough surfaces can be subjected to an elevated oxidation and/or corrosion attack(s).

Therefore, it may be necessary to post-process corresponding surfaces in order to reduce the roughness, which brings with it, however, a high expenditure.

SUMMARY OF THE INVENTION

Object of the Invention

The object of the present invention is thus to provide a method for the manufacture of components of a turbomachine, which makes possible in an efficient way, with as small an expenditure as possible, the manufacture of components having suitable property profiles, and in particular, with surfaces having little roughness, wherein a multiple number of different materials, which are as variable as possible, will find use for the manufacture of the component.

Technical Solution

This object is achieved by a method and a component with the features of the present invention. Advantageous embodiments are discussed in detail below.

The invention proposes to provide a smoothing layer for components that have been at least partially additively manufactured, at least on a surface region of the at least additively manufactured part of the component on which it is necessary, this smoothing layer being deposited by vapor deposition, in order to thus obtain a smooth surface. It is possible in a simple way therewith to provide additively manufactured components with sufficiently smooth surfaces that are suitable for turbomachines, due to the fact that the flow surfaces on which a fluid flows are sufficiently smooth, on the one hand, in order to avoid a negative influencing on the flow, and, on the other hand, in order to avoid a corrosion attack due to a surface that is too rough.

A corresponding component, which is provided with a smoothing layer, can be additively manufactured either partially or entirely, and in fact, by different known methods for the additive manufacture of components, such as selective laser melting, selective laser sintering, selective electron-beam melting, selective electron-beam sintering, and powder hardfacing.

In particular, the entire region of the component that has been additively manufactured can be provided with a corresponding smoothing layer. Of course, it is also possible to provide a smoothing layer on only a part of the component, also only on a portion of the additively manufactured part of the component, or the entire component can be provided with a smoothing layer.

The smoothing layer can be deposited by different vapor deposition techniques, such as physical or chemical vapor deposition methods, for example. Physical vapor deposition (PVD) methods can comprise, for example, thermal vaporization, sputtering, pulsed laser deposition or electron-beam deposition, wherein individual physical vapor deposition methods can be plasma-supported, such as plasma-supported sputtering, for example. A plasma support can be employed also in chemical vapor deposition (CVD), (PECVD, plasma-enhanced chemical vapor deposition).

The smoothing layer can be introduced with a thickness of 5 μm to 200 μm, in particular 10 μm to 100 μm, so that with such a smoothing layer, the surface roughness of the component, which has been introduced by the additive manufacturing method, can be compensated, and the deposited smoothing layer itself can have a sufficiently smooth surface. The smoothing effect can be realized by means of a sufficiently thick smoothing layer, whereas the manufacturing expense can be reduced by minimizing the thickness of the smoothing layer.

The material of the smoothing layer can differ from the material or materials from which the component is built up. Of course, it may be advantageous if the smoothing layer comprises one or more chemical elements that are also contained in the material from which the component is fabricated (base material) and that will be coated with the smoothing layer. The adhesion of the smoothing layer to the component can be improved or assured in this way. The smoothing layer can be formed from a metal or an alloy or a chemical compound. For a turbomachine, in that alloys such as nickel alloys, nickel-based superalloys, titanium alloys, and the like are employed as base materials for corresponding components such as flow duct limiting walls, rotating blades, guide vanes, and the like, particularly metals that are also contained as a meaningful fraction in the base materials of the component to be coated can be used for the smoothing layer. For example, an aluminum layer can be selected for the smoothing layer for a component whose base material is composed of a nickel-based alloy such as IN718, which contains nickel, chromium, iron, molybdenum, titanium, aluminum, and other minor components.

After introducing the smoothing layer, the component with the smoothing layer can be subjected to a heat treatment, in particular a diffusion annealing, so that material from the smoothing layer can diffuse into the base material and/or material from the base can diffuse into the smoothing layer, so that a good adhesive strength of the smoothing layer and an equilibration of the chemical composition will result. Another additional functional layer can be deposited onto the smoothing layer. By introducing a smoothing layer, components can be produced, whose surface displays an average roughness $R_a$ that is less than or equal to 10 µm, in particular less than or equal to 5 µm. The average roughness is determined by the average distance of a measurement point on the surface to a central line relative to the surface. In this case, the central line intersects the actual surface profile, so that the sum of the profile deviations referred to the central line is minimal. Correspondingly, the average roughness is the arithmetic mean of the deviation from the central line.

BRIEF DESCRIPTION OF THE DRAWING FIGURES

The appended drawings show in a purely schematic way, in:

FIG. 1 is a side view of a cross section of an additively manufactured component; and in FIG. 2 a partial cross section through a surface of the additively manufactured component after introduction of a smoothing layer.

DESCRIPTION OF THE INVENTION

Further advantages, characteristics and features of the present invention will be made clear in the following detailed description of an exemplary embodiment. Of course, the invention is not limited to this exemplary embodiment.

In a purely schematic cross-sectional view, FIG. 1 shows a component 1, which is built up from a plurality of layers 10, 11 and 12 disposed on top of one another. For example, the component 1 can be built up by selective laser melting, in which powder layers corresponding to the geometry of the component 1 to be produced can be selectively melted by a pulsed laser, which is moved over the powder layer, so that after the melt solidifies, the corresponding powder layer is joined to a layer of the component lying thereunder, so that the component 1 can be built up layer by layer.

Such a built-up component 1 can have a relatively rough surface 3, which is unsuitable, for example, for use in turbomachines, since the rough surface 3 can negatively influence the flow conditions for surfaces along which a fluid flows, and secondly, the rough surface can be sensitive to corrosion attacks.

Correspondingly, the surface 3 of the component 1 according to FIG. 2 is provided with a smoothing layer, which compensates for the roughness of the rough surface layer 3 of the component 1 and provides a smooth surface 4. The smoothing layer 2 is deposited by vapor deposition of a corresponding material for the smoothing layer, for example, by chemical vapor deposition (CVD). Additionally, the component 1, together with the smoothing layer 2 can be subjected to an additional heat treatment after introduction of this layer, so that material from the smoothing layer 2 diffuses into the base material of the component 1 in order to form there a partial diffusion layer 5b, while material from the base material of the component 1 can diffuse into the smoothing layer 2 in order to form there the partial diffusion layer 5a, so that a diffusion layer that makes possible a good adhesion of the smoothing layer 2 is formed at the interface between smoothing layer 2 and component 1.

The component 1 with the smooth surface 4 can be used directly, for example, as a limiting wall element of the flow duct in a stationary gas turbine or an aircraft engine or as a rotating blade or guide vane of a corresponding turbomachine.

There is also the possibility that, after introducing the smoothing layer 2 on the smooth surface 4, an additional functional layer 6 will be introduced such as, for example, a layer for corrosion protection or a thermal barrier coating, or the like.

Although the present invention has been described in detail on the basis of the exemplary embodiment, it is obvious to a person skilled in the art that the invention is not limited to this exemplary embodiment, but that modifications are possible in a way that individual features or other kinds of combinations of features can be realized, as long as they are within the protective scope of the appended claims. The present disclosure includes all combinations of the individual features proposed.

What is claimed is:

1. A method for manufacturing a component, wherein an additive method is used at least partially for the manufacture of a component from a plurality of layers each having edges, the plurality of layers defining a first surface region having a rough surface defined by the edges of the plurality of layers of the layerwise construction of the plurality of layers, wherein the first surface region of the additively manufactured part of the component is provided with a smoothing layer, which is deposited by vapor deposition, the smoothing layer including a diffusion layer that at least partially diffuses into the plurality of layers of the first surface region adhering thereto, whereby the smoothing layer forms a part of and remains on the component, and whereby the smoothing layer provides a protective coating to the first surface region during use of the component.

2. The method according to claim 1, wherein the additive manufacturing method comprises a layerwise construction of the component from powder material that is joined to form a solid component, wherein the method is selected from a group that comprises selective laser melting, selective electron-beam melting, selective laser sintering, selective electron-beam sintering, and powder hardfacing.

3. The method according to claim 1, wherein a second surface region on a portion of the component is provided with a smoothing layer.

4. The method according to claim 1, wherein the vapor deposition is selected from the group that comprises physical vapor deposition, chemical vapor deposition, thermal deposition, electron-beam deposition, pulsed laser deposition, plasma-enhanced vapor deposition, and plasma-enhanced chemical vapor deposition.

5. The method according to claim 1, wherein the smoothing layer has a thickness of 5 µm to 200 µm.

6. The method according to claim 1, wherein the smoothing layer is formed from a material having one or more chemical elements of the base material of the component being coated.

7. The method according to claim 1, wherein the smoothing layer is formed from a pure metal or an alloy or a chemical compound.

8. The method according to claim 1, wherein the component with the smoothing layer is subjected to a heat treatment.

9. The method according to claim 1, further comprising the step of:

depositing another functional layer on the smoothing layer.

10. The method according to claim 1, wherein the component is selected from the group that comprises flow duct limiting walls, rotating blades and guide vanes, and/or the component has as a base material an alloy from the group that comprises nickel-based alloys, nickel-based superalloys, iron alloys, titanium alloys, and cobalt alloys.

11. The method according to claim 1, wherein the component is formed from a nickel-based alloy and the smoothing layer is formed from aluminum or nickel.

12. The method according to claim 1, wherein the smoothing layer has an average roughness $R_a$ that is less than or equal to 10 μm.

13. The method according to claim 1, wherein the component has at least one flow surface, and the at least one flow surface is provided with the smoothing layer.

14. The method according to claim 5, wherein the smoothing layer has a thickness of 10 μm to 100 μm.

15. The method according to claim 8, wherein the heat treatment is diffusion annealing.

16. The method according to claim 12, wherein the smoothing layer has an average roughness $R_a$ that is less than or equal to 5 μm.

17. The method according to claim 9, wherein the functional layer is a layer for corrosion protection.

18. The method according to claim 9, wherein the functional layer is a thermal barrier coating.

* * * * *